(12) United States Patent
Shanan et al.

(10) Patent No.: US 12,261,608 B2
(45) Date of Patent: Mar. 25, 2025

(54) CONTROL AND CALIBRATION OF EXTERNAL OSCILLATORS

(71) Applicant: Analog Devices, Inc., Wilmington, MA (US)

(72) Inventors: Hyman Shanan, Piscataway, NJ (US); John Kenney, West Windsor, NJ (US)

(73) Assignee: Analog Devices, Inc., Wilmington, MA (US)

(*) Notice: Subject to any disclaimer, the term of this patent is extended or adjusted under 35 U.S.C. 154(b) by 0 days.

(21) Appl. No.: 18/247,691

(22) PCT Filed: Dec. 7, 2021

(86) PCT No.: PCT/US2021/072775
§ 371 (c)(1),
(2) Date: Apr. 3, 2023

(87) PCT Pub. No.: WO2022/126097
PCT Pub. Date: Jun. 16, 2022

(65) Prior Publication Data
US 2023/0412175 A1 Dec. 21, 2023

Related U.S. Application Data (60) Provisional application No. 63/122,575, filed on Dec. 8, 2020.

(51) Int. Cl.
*H03D 3/24* (2006.01)
*H03L 1/02* (2006.01)
(Continued)

(52) U.S. Cl.
CPC ............ *H03L 7/099* (2013.01); *H03L 1/02* (2013.01); *H03L 7/189* (2013.01); *H04B 1/16* (2013.01); *H03L 2207/06* (2013.01)

(58) Field of Classification Search
CPC ... H04L 7/0033; H04L 7/0337; H04L 27/152; H04L 7/033; H03L 7/0891; H03L 7/093;
(Continued)

(56) References Cited

U.S. PATENT DOCUMENTS 10,797,713 B1 * 10/2020 Venkatesan ............ H03L 7/189
11,031,943 B1 * 6/2021 Gambini ................. H03L 7/099
(Continued)

FOREIGN PATENT DOCUMENTS

JP   H 09162730 A   6/1997
JP   H11298324 A    10/1999
(Continued)

OTHER PUBLICATIONS

Office Action with Translation for Japanese Application No. 2023-527078 dated Apr. 1, 2024, in 10 pages.
(Continued)

*Primary Examiner* — Khai Tran
(74) *Attorney, Agent, or Firm* — Knobbe, Martens, Olson & Bear, LLP (57) ABSTRACT

Apparatus and methods for control and calibration of external oscillators are provided herein. In certain embodiments, an electronic oscillator system includes a semiconductor die and a controllable oscillator that is external to the semiconductor die. The oscillation frequency of the controllable oscillator is tuned by a first varactor and a second varactor. The semiconductor die includes a phase-locked loop (PLL) that provides fine tuning to the controllable oscillator by controlling the first varactor, and a calibration circuit that provides coarse tuning to the controllable oscillator by controlling the second varactor.

20 Claims, 9 Drawing Sheets

(51) Int. Cl.
  *H03L 7/099* (2006.01)
  *H03L 7/189* (2006.01)
  *H04B 1/16* (2006.01)

(58) Field of Classification Search
  CPC ...... H03L 2207/06; H03L 7/187; H03J 3/185; H03J 3/04
  USPC ........ 375/376, 373, 375; 455/103, 127, 307, 455/325; 327/156; 331/177 R
  See application file for complete search history.

(56) References Cited

U.S. PATENT DOCUMENTS

| | | | |
|---|---|---|---|
| 11,336,227 B2* | 5/2022 | Yin | .......................... H03B 5/04 |
| 2007/0176694 A1* | 8/2007 | Rhee | .......................... H03L 7/10 331/16 |
| 2008/0024230 A1 | 1/2008 | Pera et al. | |
| 2009/0111408 A1 | 4/2009 | Rodal | |
| 2013/0057325 A1 | 3/2013 | Dong et al. | |
| 2015/0180486 A1 | 6/2015 | Shanan et al. | |
| 2015/0288368 A1 | 10/2015 | Yun et al. | |
| 2017/0373694 A1 | 12/2017 | Roithmeier et al. | |
| 2022/0337189 A1* | 10/2022 | Huang | .................. H03B 5/1253 |

FOREIGN PATENT DOCUMENTS

| | | |
|---|---|---|
| JP | 2005-229548 A | 8/2005 |
| JP | 2007-110504 A | 4/2007 |
| JP | 2012-239168 A | 12/2012 |
| JP | 2015-154394 A | 8/2015 |

OTHER PUBLICATIONS

International Search Report and Written Opinion for International Application No. PCT/US2021/072775 dated Apr. 7, 2022 in 10 pages.

Decision of Rejection with Translation issued for JP Application No. 2023-527078 dated Aug. 19, 2024, in 8 pages.

* cited by examiner

CONTROL AND CALIBRATION OF EXTERNAL OSCILLATORS

FIELD OF THE DISCLOSURE

Embodiments of the invention relate to electronic systems, and more particularly to, control and calibration of external oscillators.

BACKGROUND

Voltage-controlled oscillators (VCOs) are widely used in electronic and communication applications, such as clock generation and distribution, carrier synthesis, and data recovery. VCOs can include an oscillator core that generates an oscillating output signal and a resonator (for example, an inductor-capacitor tank) that presents the oscillator core with variable electrical characteristics such as capacitance and/or inductance. The frequency of oscillation depends at least partly on the value of the variable electrical characteristics, and thus tuning the resonator provides a way to control the frequency of oscillation of the output signal.

VCOs can be included in control loops, such as phase-locked loops (PLLs). Such control loops can use feedback to set an input control voltage of the VCO to a desired value.

SUMMARY OF THE DISCLOSURE

Apparatus and methods for control and calibration of external oscillators are provided. In certain embodiments, an electronic oscillator system includes a semiconductor die and a controllable oscillator that is external to the semiconductor die. The oscillation frequency of the controllable oscillator is tuned by a first varactor and a second varactor. The semiconductor die includes a phase-locked loop (PLL) that provides fine tuning to the controllable oscillator by controlling the first varactor, and a calibration circuit that provides coarse tuning to the controllable oscillator by controlling the second varactor.

In one aspect, an electronic oscillator system includes a semiconductor die, a controllable oscillator external to the semiconductor die, a first varactor configured to tune an oscillation frequency of the controllable oscillator, and a second varactor configured to tune the oscillation frequency of the controllable oscillator. The semiconductor die includes a phase-locked loop (PLL) configured to provide fine tuning to the controllable oscillator by controlling the first varactor, and a calibration circuit configured to provide coarse tuning to the controllable oscillator by controlling the second varactor.

In another aspect, a method of electronic oscillator control is provided. The method includes tuning an oscillation frequency of a controllable oscillator using a first varactor, the controllable oscillator external to a semiconductor die. The method further includes tuning the oscillation frequency of the controllable oscillator using a second varactor, controlling the first varactor to provide fine tuning to the controllable oscillator using a phase-locked loop (PLL) on the semiconductor die, and controlling the second varactor to provide coarse tuning to the controllable oscillator using a calibration circuit of the semiconductor die.

In another aspect, a radio frequency communication system is provided. The radio frequency communication system includes a mixer controlled by an oscillator signal, and a local oscillator including a semiconductor die, a controllable oscillator external to the semiconductor die and configured to output the oscillator signal, a first varactor configured to tune an oscillation frequency of the controllable oscillator, and a second varactor configured to tune the oscillation frequency of the controllable oscillator. The semiconductor die includes a phase-locked loop (PLL) configured to provide fine tuning to the controllable oscillator by controlling the first varactor, and a calibration circuit configured to provide coarse tuning to the controllable oscillator by controlling the second varactor.

DETAILED DESCRIPTION

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Control and calibration of external controllable oscillators are provided herein. In certain embodiments, an electronic oscillator system includes a semiconductor die and a controllable oscillator (for instance, a VCO) that is external to the semiconductor die. The oscillation frequency of the controllable oscillator is tuned by a first varactor and a second varactor. The semiconductor die includes a phase-locked loop (PLL) that provides fine tuning to the controllable oscillator by controlling the first varactor, and a calibration circuit that provides coarse tuning to the controllable oscillator by controlling the second varactor.

Accordingly, the controllable oscillator can be controlled using a first loop with low gain and a second loop with higher gain than the second loop. This in turn achieves low noise, wide tuning range, and an ability to implement the PLL on the semiconductor die while operating within supply voltage limitations associated with typical semiconductor die manufacturing processes.

The teachings herein are applicable to a wide range of electronic systems and applications. For example, transceivers, such as land mobile radio transceivers, can employ external VCOs as local oscillators (LOs).

Figure 1:
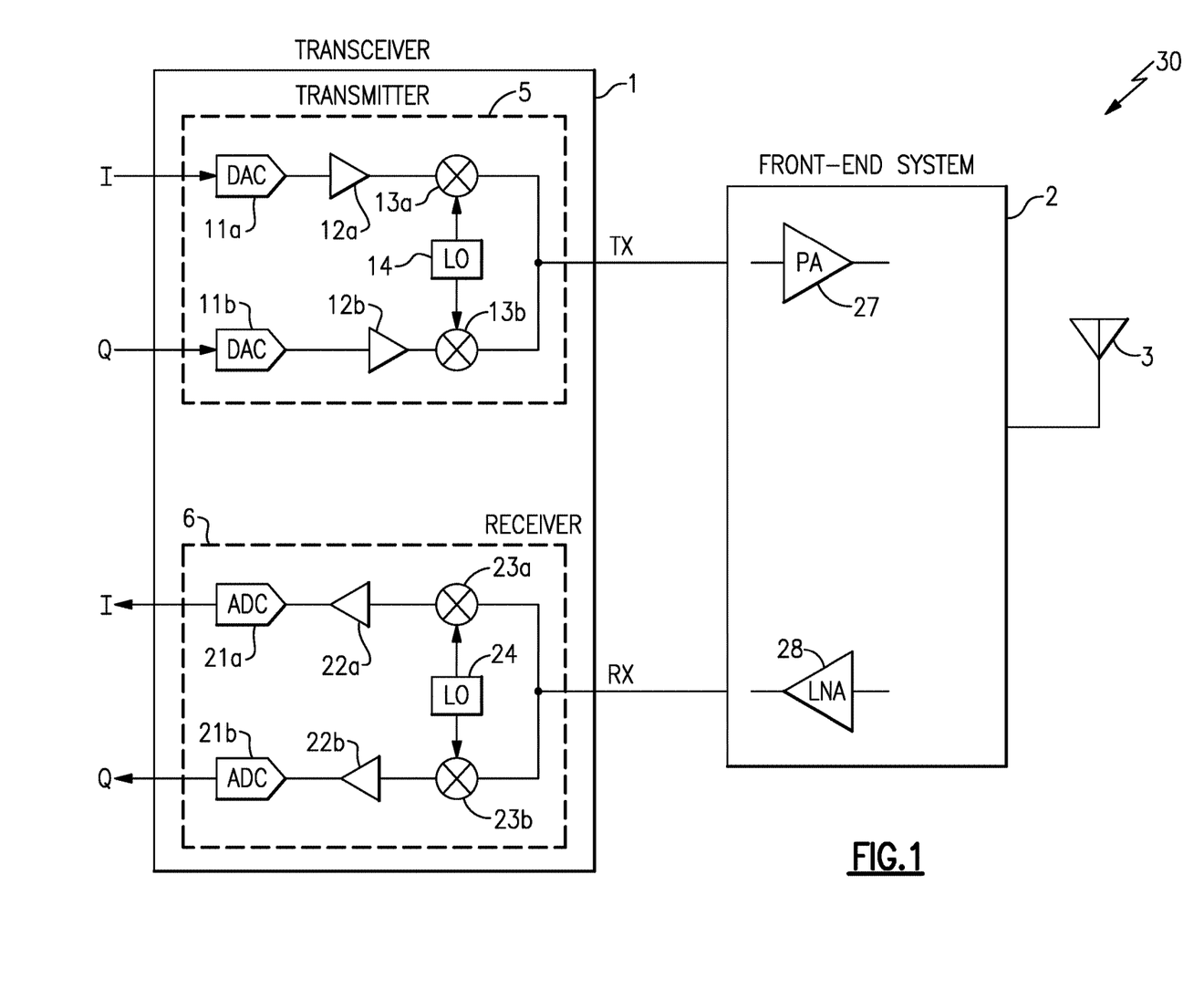
FIG. 1 is a schematic diagram of one embodiment of a radio frequency (RF) communication system.

FIG. 1 is a schematic diagram of one embodiment of an RF communication system 30. The RF communication system 30 includes a transceiver 1, a front-end system 2, and an antenna 3. The transceiver 1 of FIG. 1 can include one or more local oscillators (LOs) implemented with tuning and calibration loops in accordance with the teachings herein. However, the teachings herein are applicable to other configurations of electronic circuitry.

In the illustrated embodiment, the transceiver 1 includes a transmitter 5 and a receiver 6. Although not depicted in FIG. 1, the transceiver 1 can also include other circuitry, for example, observation receivers, control circuits, and/or additional transmitters and/or receivers.

Although FIG. 1 depicts the transceiver 1 as including one transmitter and one receiver, the transceiver can include additional transmitter(s), receiver(s), and/or observation receiver(s).

In the illustrated embodiment, the transmitter 5 includes an I-path DAC 11a, an I-path amplifier 12a, an I-path mixer 13a, a Q-path DAC 11b, a Q-path amplifier 12b, a Q-path mixer 13b, and a transmit local oscillator (LO) 14. Although one example of transmitter circuitry is depicted, a transmitter can be implemented in other ways.

With respect to signal transmission, the I-path DAC 11a converts a digital I signal to an analog I signal, which is amplified by the I-path amplifier 12a. Additionally, the Q-path DAC 11b converts a digital Q signal to an analog Q signal, which is amplified by the Q-path amplifier 12b. The transmit LO 14 provides an I-path clock signal to the I-path mixer 13a, which upconverts the amplified analog I signal. The transmit LO 14 further provides a Q-path clock signal to the Q-path mixer 13b, which upconverts the amplified analog Q signal. The outputs of the I-path mixer 13a and the Q-path mixer 13b are combined to generate an RF transmit signal TX that is provided to the front-end system 2.

With continuing reference to FIG. 1, the receiver 6 includes an I-path ADC 21a, an I-path amplifier 22a, an I-path mixer 23a, a Q-path ADC 21b, a Q-path amplifier 22b, a Q-path mixer 23b, and a receive LO 24. Although one example of receiver circuitry is depicted, a receiver can be implemented in other ways.

With respect to signal reception, the receiver 6 receives an RF receive signal RX from the front-end system 2. The receive LO 24 provides an I-path clock signal to the I-path mixer 23a and a Q-path clock signal to the Q-path mixer 23b. The I-path mixer 23a downconverts the RF receive signal RX using the I-path clock signal to generate an analog I signal. The analog I signal is amplified by the I-path amplifier 22a and digitized by the I-path ADC 21a to generate a digital I signal. The Q-path mixer 23b downconverts the RF receive signal RX using the Q-path clock signal to generate an analog Q signal. The analog Q signal is amplified by the Q-path amplifier 22b and digitized by the Q-path ADC 21b to generate a digital Q signal.

The transceiver 1 can be implemented in accordance with any of the embodiments herein.

As shown in FIG. 1, the front-end system 2 includes a power amplifier 27 that amplifies the RF transmit signal TX for transmission on the antenna 3, and a low noise amplifier 28 that generates the RF receive signal RX based on amplifying a received signal from the antenna 3. Although only the power amplifier 27 and the low noise amplifier 28 are depicted, the front-end system 2 can include other components including, but not limited to, filters, switches, duplexers, diplexers, couplers, and/or other components. Moreover, transmit and receive channels need not share an antenna, but rather can use separate antennas.

The transceiver 1 can handle signals of a variety of frequencies, including not only RF signals between 30 MHz and 7 GHz, but also signals of higher frequencies, such as those in the X band (about 7 GHz to 12 GHz), the K u band (about 12 GHz to 18 GHz), the K band (about 18 GHz to 27 GHz), the K a band (about 27 GHz to 40 GHz), the V band (about 40 GHz to 75 GHz), and/or the W band (about 75 GHz to 110 GHz). Accordingly, the teachings herein are applicable to a wide variety of RF communication systems, including microwave systems.

Figure 2A:
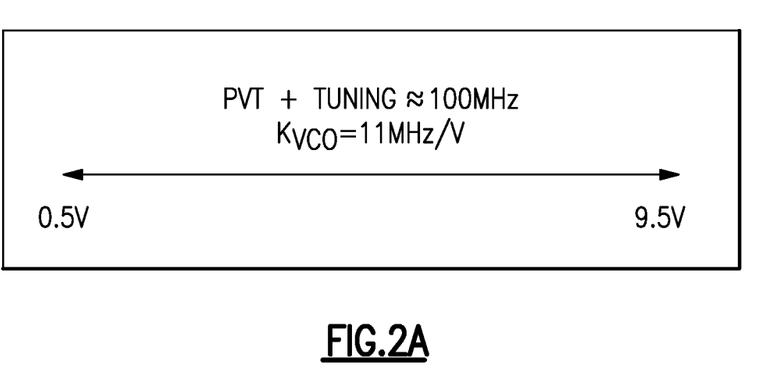
FIG. 2A is a schematic diagram of one example of tuning for an external voltage controllable oscillator (VCO).

FIG. 2A is a schematic diagram of one example of tuning for an external VCO. In this example, the external VCO is tuned using one loop having a frequency versus voltage gain ($K_{VCO}$) of 11 MHz/volt. When using a 9 V tuning range (from 0.5 V to 9.5 V), the external VCO has 100 MHz of frequency range to account for desired tuning range as well as process, voltage, and/or temperature (PVT) variation.

Figure 2B:
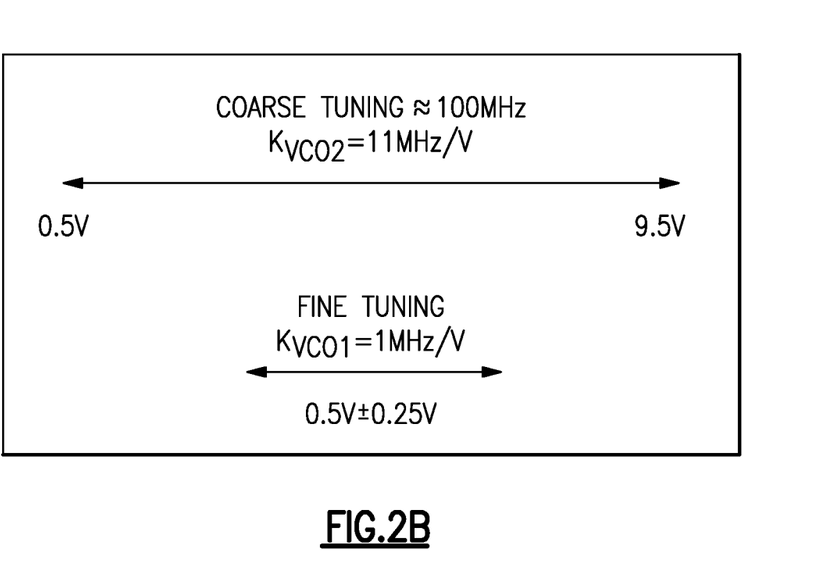
FIG. 2B is a schematic diagram of another example of tuning for an external VCO.

FIG. 2B is a schematic diagram of another example of tuning for an external VCO. In this example, the external VCO is tuned using a first loop for fine tuning having a $K_{VCO1}$ of 1 MHz/volt and a second loop for coarse tuning having a $K_{VCO2}$ of 11 MHz/volt. The first loop operates with a relative small voltage tuning range of 1V, allowing the first loop to be implemented on a semiconductor die while still operating within typical supply voltage limitations associated with semiconductor die manufacturing processes. The first loop also has low gain, which is better for noise. The second loop operates with a wide voltage tuning range of 9V (from 0.5 V to 9.5 V) to provide wide frequency range of 100 MHz to account for PVT.

Although various examples of $K_{VCO}$ values, voltage ranges, and frequencies have been shown in FIGS. 2A and 2B, other values are possible.

Figure 3A:
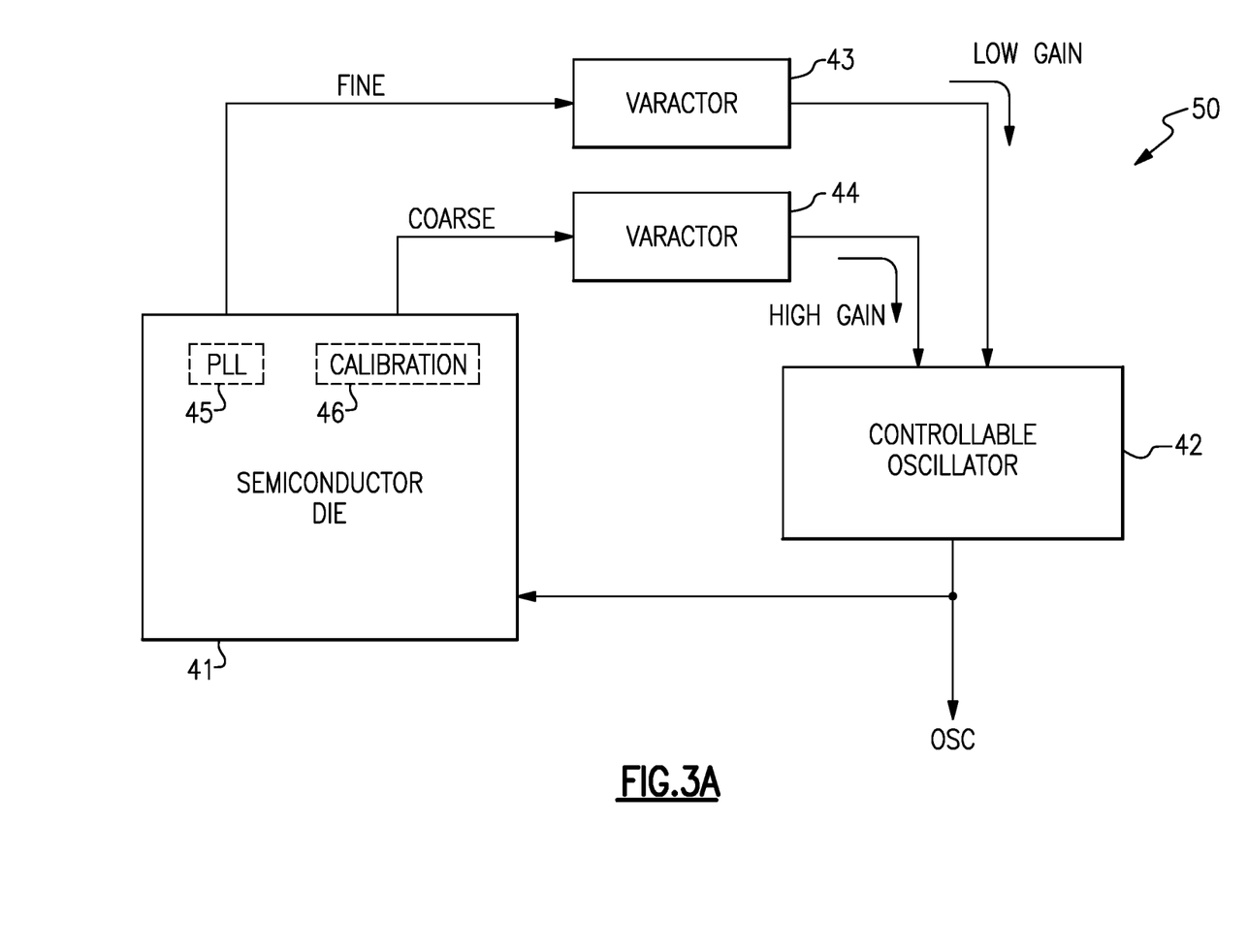
FIG. 3A is a schematic diagram of an electronic oscillator system according to one embodiment.

FIG. 3A is a schematic diagram of an electronic oscillator system 50 according to one embodiment. The electronic oscillator system 50 includes a semiconductor die 41 and a controllable oscillator 42 that is external to the semiconductor die 41. The electronic oscillator system 50 further includes a first varactor 43 controlled by a fine control signal FINE from the semiconductor die 41 and a second varactor 44 controlled by a coarse control signal COARSE from the semiconductor die 41.

As shown in FIG. 3A, the controllable oscillator 42 outputs an oscillation signal OSC that has a frequency of oscillation that is controlled by the fine control signal FINE and by the coarse control signal COARSE.

Accordingly, the oscillation frequency of the controllable oscillator 42 is tuned by the first varactor 43 and the second varactor 44.

With continuing reference to FIG. 3A, the semiconductor die 41 includes a phase-locked loop (PLL) 45 that provides fine tuning to the controllable oscillator 42 by controlling the fine control signal FINE provided to the first varactor 43. Additionally, the semiconductor die 41 further includes a calibration circuit 46 that provides coarse tuning to the controllable oscillator 42 by controlling the coarse control signal COARSE provided to the second varactor 44. The oscillation signal OSC is provided to the semiconductor die 41 to provide feedback for adjusting the fine control signal FINE and the coarse control signal COARSE.

By implementing the electronic oscillator system 50 in this manner, the controllable oscillator 42 can be controlled using a first loop with low gain (LOW GAIN loop) and a second loop with higher gain (HIGH GAIN loop). This in turn achieves low noise, wide tuning range, and an ability to implement the PLL 45 on the semiconductor die 41 while operating within supply voltage limitations associated with typical semiconductor die manufacturing processes.

Figure 3B:
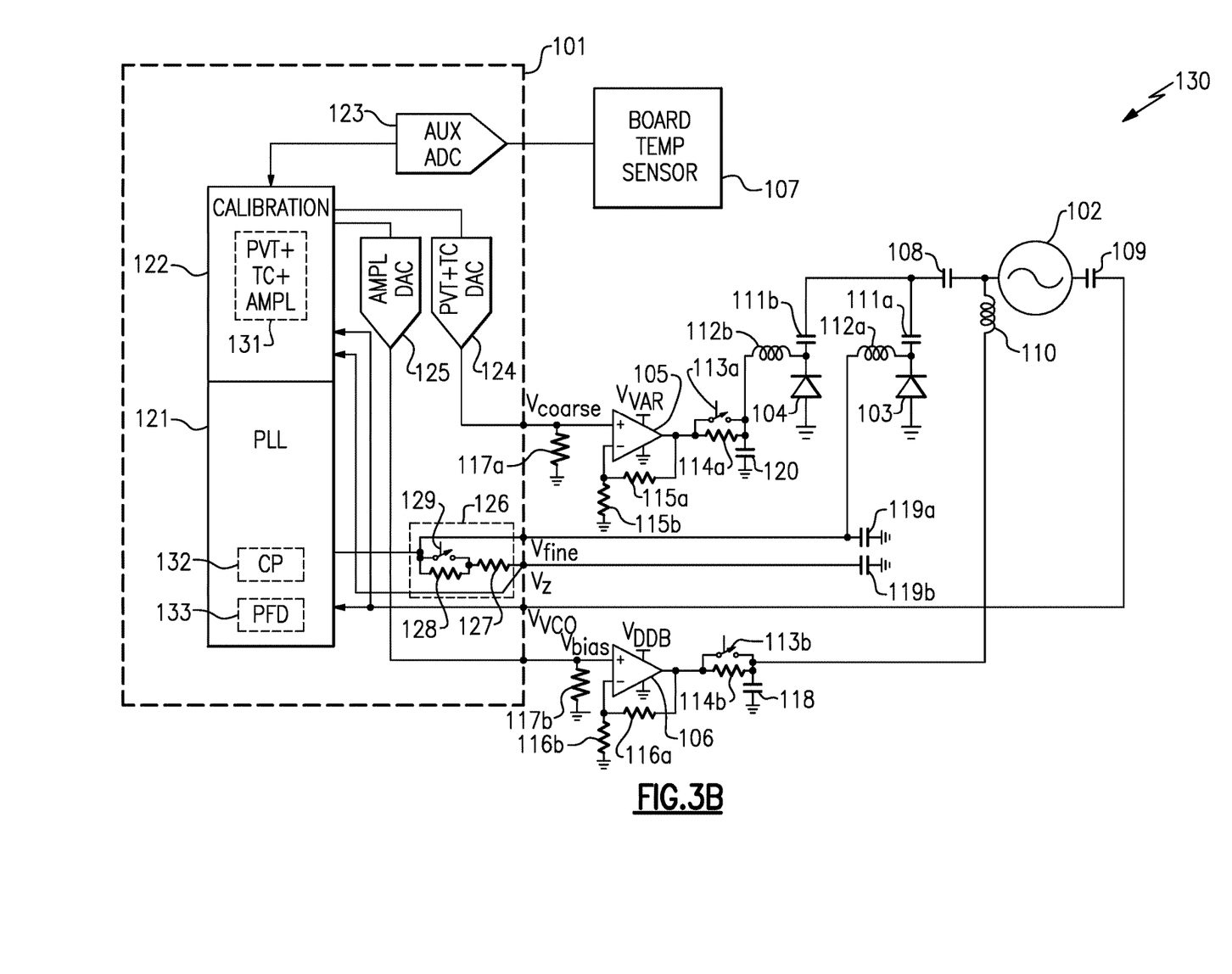
FIG. 3B is a schematic diagram of an electronic oscillator system according to another embodiment.

FIG. 3B is a schematic diagram of an electronic oscillator system 130 according to another embodiment. The electronic oscillator system 130 includes a semiconductor die 101 and a variety of components external to the semiconductor die 101 on a circuit board.

In the illustrated embodiment, the external components include an external VCO 102, a first varactor 103, a second varactor 104, a first amplifier 105, a second amplifier 106, a temperature sensor 107, a VCO input capacitor 108, a VCO output capacitor 109, a VCO bias inductor 110, a first varactor series capacitor 111a, a second varactor series capacitor 111b, a first varactor biasing inductor 112a, a second varactor biasing inductor 112b, a coarse resistor bypass switch 113a, a bias resistor bypass switch 113b, a coarse resistor 114a, a bias resistor 114b, first voltage divider resistors 115a/115b, second voltage divider resistors 116a/116b, a first amplifier input resistor 117a, a second amplifier input resistor 117b, a bias capacitor 118, a fine capacitor 119a, a sense capacitor 119b, and a coarse capacitor 120.

The semiconductor die 101 of FIG. 3B includes a PLL 121, a coarse tuning and calibration circuit 122, an auxiliary analog-to-digital converter (ADC) 123, a PVT and coarse tuning digital-to-analog converter (DAC) 124, an amplitude DAC 125, and a switchable resistor network 126. The switchable resistor network 126 includes a fixed resistor 127, a switchable resistor 128, and a resistor bypass switch 129. The semiconductor die 101 also including various pins or pads including a coarse tuning pin $V_{coarse}$, a fine tuning pin $V_{fine}$, a range sensing pin $V_Z$, a VCO sensing pin $V_{vco}$, and a VCO biasing pin $V_{bias}$.

The external VCO 102 is tuned by both the first varactor 103 and the second varactor 104. The first varactor 103 is controlled by the voltage of the fine tuning pin $V_{fine}$ set by the PLL 121, which can operate with low voltage (for instance, using a 1 V charge pump 132). As shown in FIG. 3B, the PLL 121 receives the VCO's clock signal on the VCO sensing pin $V_{vco}$, which can be used to generate a feedback clock signal for the PLL's detector. For example, the PLL 121 can include a phase and/or frequency detector (PFD) 133 that compares the feedback clock signal to a reference clock signal, and the output of the PFD is used to control the PLL's charge pump 132.

The second varactor 104 is controlled by the coarse tuning and calibration circuit 122, which can include tuning circuitry 131 for PVT, temperature coefficient (TC), and/or amplitude control. The coarse tuning and calibration circuit 122 provides a digital coarse control signal to the DAC 124, which outputs a current to the coarse tuning pin $V_{coarse}$. Although shown as a single DAC 124 for providing PVT and coarse tuning, multiple DACs can be used.

The current flows from the DAC 124 through a resistor 117a to generate a coarse tuning voltage that is scaled by the amplifier 105 to generate a scaled coarse tuning voltage that tunes the second varactor 104. Although an example in which the coarse tuning voltage is generated by a current flowing a current DAC through a resistor, other implementations are possible, such as configurations in which a voltage DAC generates the coarse tuning voltage. The external amplifier 105 is used to amplify the voltage on $V_{coarse}$ to a voltage level suitable for varactor control, for instance, up to about 20V. The external amplifier 105 is powered by a varactor voltage supply $V_{VAR}$ suitable for generating such voltage levels. The noise from the amplifier 105 is filtered by a low frequency RC filter that can be selectively bypassed (for instance, during calibration).

In this example, the coarse tuning and calibration circuit 122 receives temperature information from the temperature sensor 107 by way of the ADC 123, as well as the VCO's output clock signal from the VCO sensing pin $V_{vco}$, and tuning range information from the range sensing pin $V_Z$.

In certain implementations, the coarse tuning and calibration circuit 122 initially performs a VCO amplitude calibration based on biasing the external VCO 102 using the VCO biasing pin $V_{bias}$ (and using the second amplifier 106 powered by bias supply voltage $V_{DDB}$ to provide scaling) and based on observations of the VCO output clock signal from the VCO sensing pin $V_{vco}$. After the initial amplitude calibration, the coarse tuning and calibration circuit 122 can coarsely tune the external VCO 102 using the second varactor 104.

During normal operation after amplitude calibration and coarse tuning, the PLL 121 serves to provide fine tuning to the external VCO 102 by way of controlling the first varactor 103. Additionally, the coarse tuning and calibration circuit 122 can monitor the tuning voltage of the PLL 121 using the range sensing pin $V_Z$, and perform a coarse adjustment when the tuning voltage exceeds an upper threshold or falls below a lower threshold. Thus, the coarse adjustment can serve to maintain the tuning voltage within a desired tuning voltage range set by the upper and lower thresholds.

Although an example with VCO amplitude scaling has been described, such amplitude scaling can be omitted. For example, the amplitude DAC 125 and the second amplifier 106 need not be included for bringing the external VCO 102 to a desired target amplitude.

Figure 4:
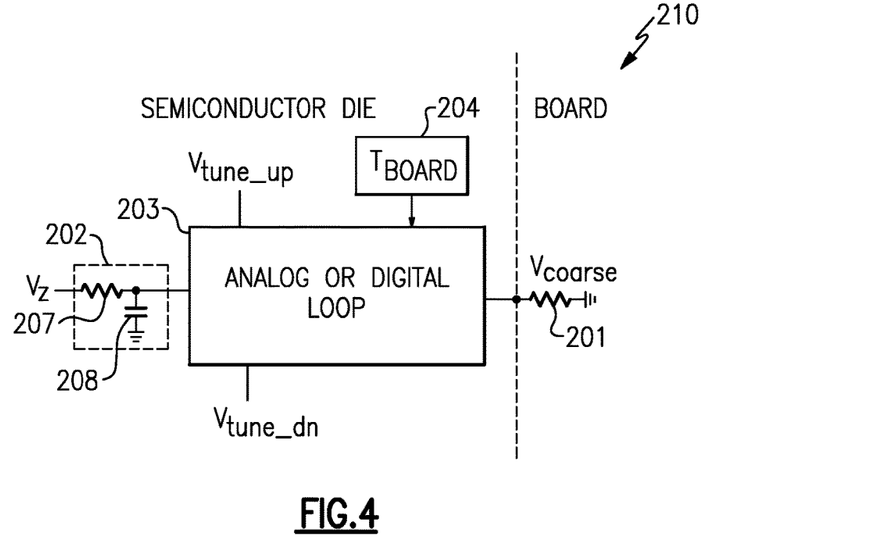
FIG. 4 is a schematic diagram of an external VCO tracking loop according to one embodiment.

FIG. 4 is a schematic diagram of an external VCO tracking loop 210 according to one embodiment. The external VCO tracking loop 210 includes a coarse control resistor 201 on a board, and a low-pass filter 202 and a control loop core 203 formed on a semiconductor die that is attached to the board.

Although certain components are shown as being on the board or on the semiconductor die, other arrangements are possible.

The control loop core 203 can be an analog loop or a digital loop. The control loop core 203 monitors the range sensing signal $V_z$ (generated by sensing the fine voltage used to control the fine varactor) by comparing the signal $V_z$ against an upper threshold ($V_{tune\_up}$) and a lower threshold ($V_{tune\_dn}$). The external VCO tracking loop 210 sets the value of the signal $V_{coarse}$ such that the value of the signal $V_z$ (and thus the fine tuning voltage $V_{fine}$ of FIG. 3B) is kept between the two thresholds. The external VCO tracking loop can receive temperature information 204 ($T_{BOARD}$), in some implementations.

In the illustrated embodiment, the low-pass filter 202 is included for filtering the signal $V_z$. The low-pass filter 202 includes a series resistor 207 and a shunt capacitor 208, in this example.

Figure 5A:
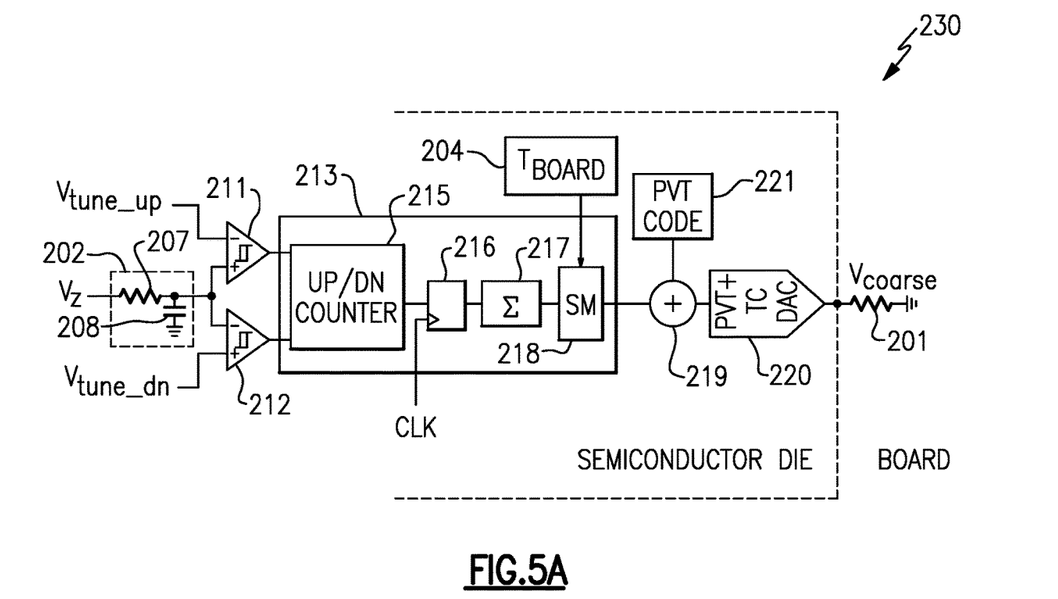
FIG. 5A is a schematic diagram of an external VCO tracking loop according to another embodiment.

FIG. 5A is a schematic diagram of an external VCO tracking loop 230 according to another embodiment. The external VCO tracking loop 230 includes a coarse control resistor 201 on a board, and a low-pass filter 202, a first comparator 211, a second comparator 212, a comparator processing circuit 213, an adder 219, and a PVT/TC DAC 220 formed on a semiconductor die that is attached to the board.

In this embodiment, analog hysteretic comparators 211/212 are used to compare the sense voltage $V_z$ (after low-pass filtering by the low-pass filter 202) to the upper threshold $V_{tune\_up}$ and the lower threshold $V_{tune\_dn}$. Additionally, the comparator outputs are processed by the comparator processing circuit 213, which includes an up/down counter 215, a flip-flop 216 (controlled by a clock signal CLK), an integrator 217, and a modulator 218. The output of the comparator processing circuit 213 is added in the digital domain to the PVT code 221 set by the PVT calibration loop, and thereafter provided to the PVT/TC DAC 220.

Figure 5B:
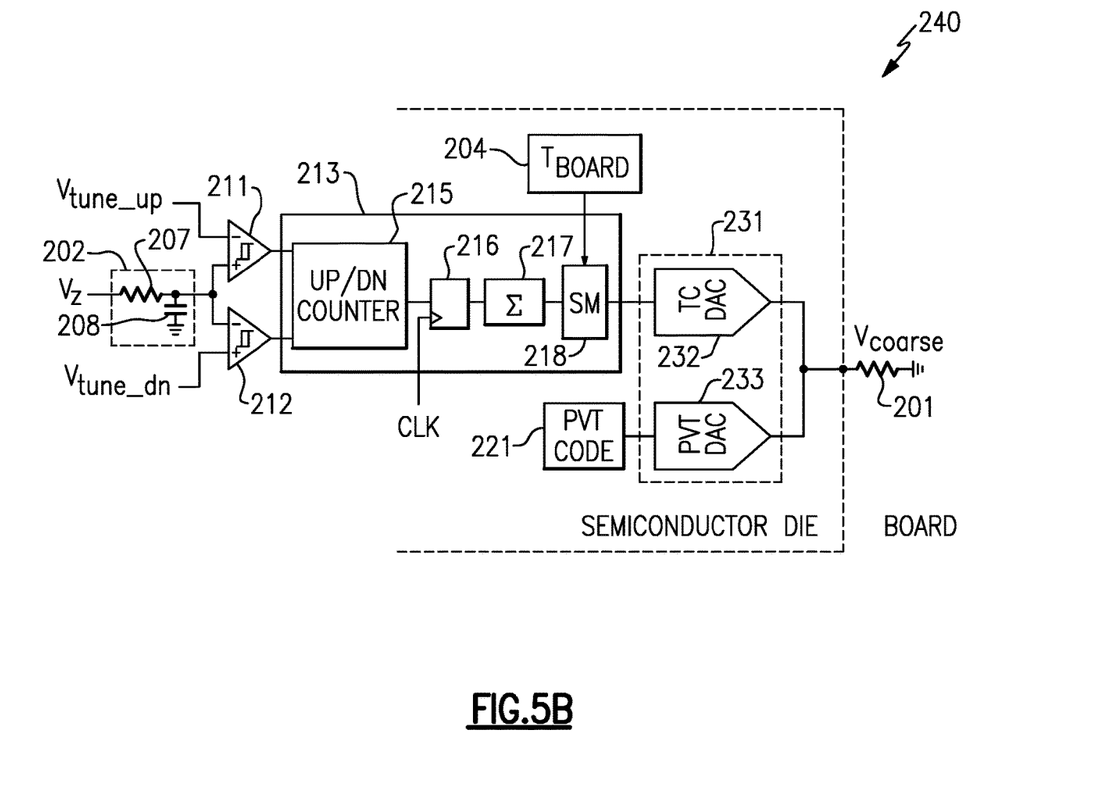
FIG. 5B is a schematic diagram of an external VCO tracking loop according to another embodiment.

FIG. 5B is a schematic diagram of an external VCO tracking loop 240 according to another embodiment.

The external VCO tracking loop 240 of FIG. 5B is similar to that of the external VCO tracking loop 230 of FIG. 5A, except that separate DACs 231 are used PVT and TC. Thus, a TC DAC 232 is included for temperature control and a PVT DAC 233 is provided for PVT control, with the DAC outputs combined. Implementing the system in this manner can reduce DAC dynamic range specifications.

Figure 6:
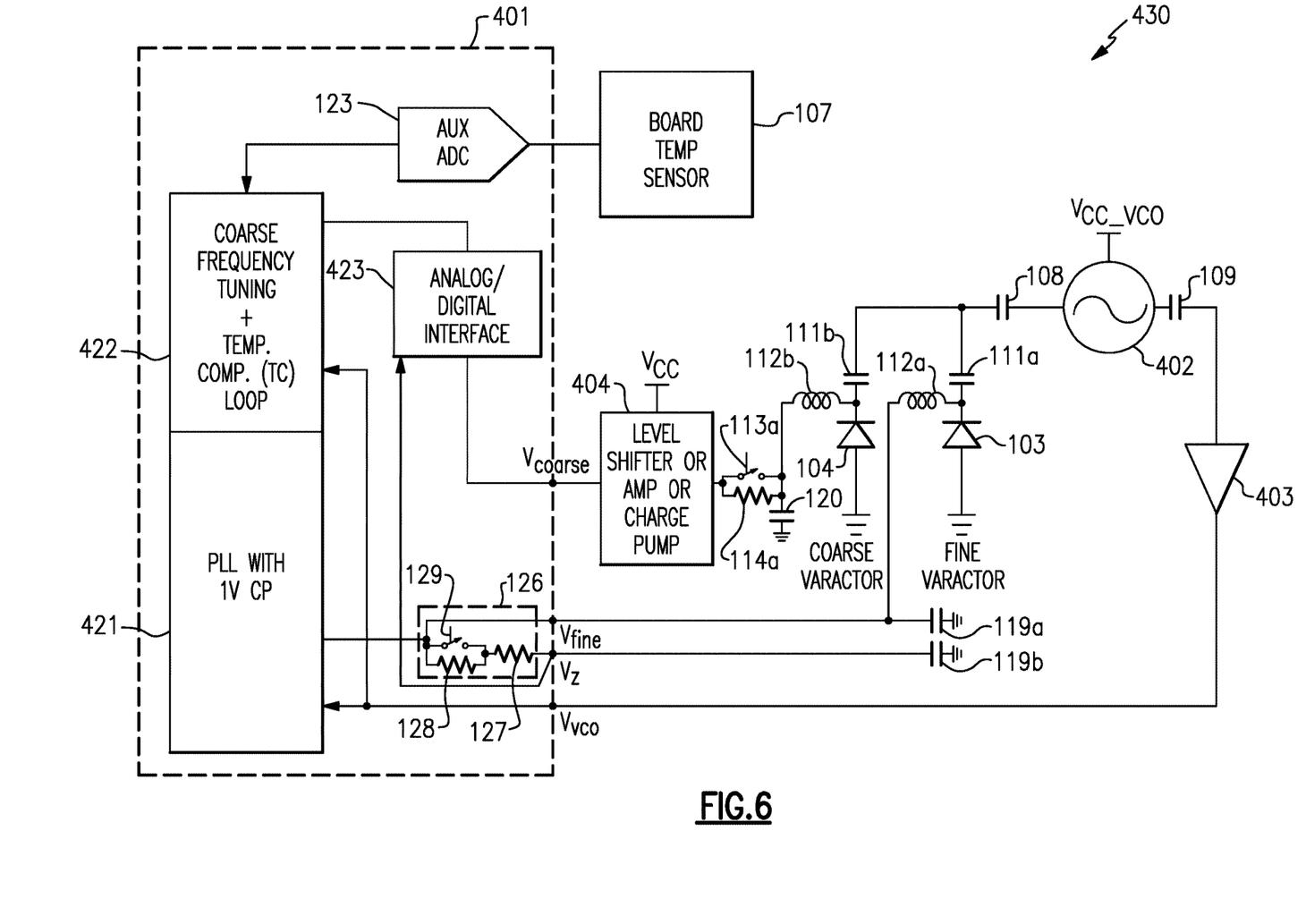
FIG. 6 is a schematic diagram of an electronic oscillator system according to another embodiment.

FIG. 6 is a schematic diagram of an electronic oscillator system 430 according to another embodiment. The electronic oscillator system 430 includes a semiconductor die 401 and a variety of components external to the semiconductor die 401 on a circuit board.

In the illustrated embodiment, the external components include an external VCO 402 (powered by a varactor supply voltage $V_{CC\_VCO}$), a first varactor 103, a second varactor 104, a first amplifier 105, a second amplifier 106, a temperature sensor 107, a VCO input capacitor 108, a VCO output capacitor 109, a first varactor series capacitor 111a, a second varactor series capacitor 111b, a first varactor biasing inductor 112a, a second varactor biasing inductor 112b, a coarse resistor bypass switch 113a, a coarse resistor 114a, a bias capacitor 118, a fine capacitor 119a, a sense capacitor 119b, a coarse capacitor 120, a VCO clock buffer 403, and a coarse voltage scaling circuit 404.

The semiconductor die 401 of FIG. 6 includes a PLL 421, a coarse frequency tuning and temperature compensation (TC) calibration circuit 422 (also referred to as a coarse frequency tuning and TC calibration loop), an auxiliary analog-to-digital converter (ADC) 123, a switchable resistor network 126, and an analog/digital interface 423. The switchable resistor network 126 includes a fixed resistor 127, a switchable resistor 128, and a resistor bypass switch 129. The semiconductor die 401 also including various pins or pads including a coarse tuning pin $V_{coarse}$, a fine tuning pin $V_{fine}$, a range sensing pin $V_Z$, and a VCO sensing pin $V_{vco}$.

The external VCO 402 is tuned by both the first varactor 103 (fine varactor) and the second varactor 104 (coarse varactor). The first varactor 103 is controlled by the voltage of the fine tuning pin $V_{fine}$ set by the PLL 421, which operates with a low voltage (1 V or less, in this example) charge pump. As shown in FIG. 6, the PLL 421 receives the VCO's clock signal (through clock driver 403, in this example) on the VCO sensing pin $V_{vco}$.

The second varactor 104 (coarse varactor) is controlled by the coarse frequency tuning and TC calibration loop 422, which controls a value of the coarse voltage pin $V_{coarse}$ by way of the analog/digital interface 423. The voltage level of the coarse voltage pin $V_{coarse}$ stepped up by the coarse voltage scaling circuit 404 to set a bias voltage of the second varactor 104 (coarse varactor). The coarse voltage scaling circuit 404 can include a level shifter, an amplifier, a charge pump, and/or other suitable circuit that serves to step up the bias voltage of the coarse varactor 104 from a low voltage domain associated with the semiconductor die 401 to a high voltage domain associated with the external VCO 402.

Figure 7:
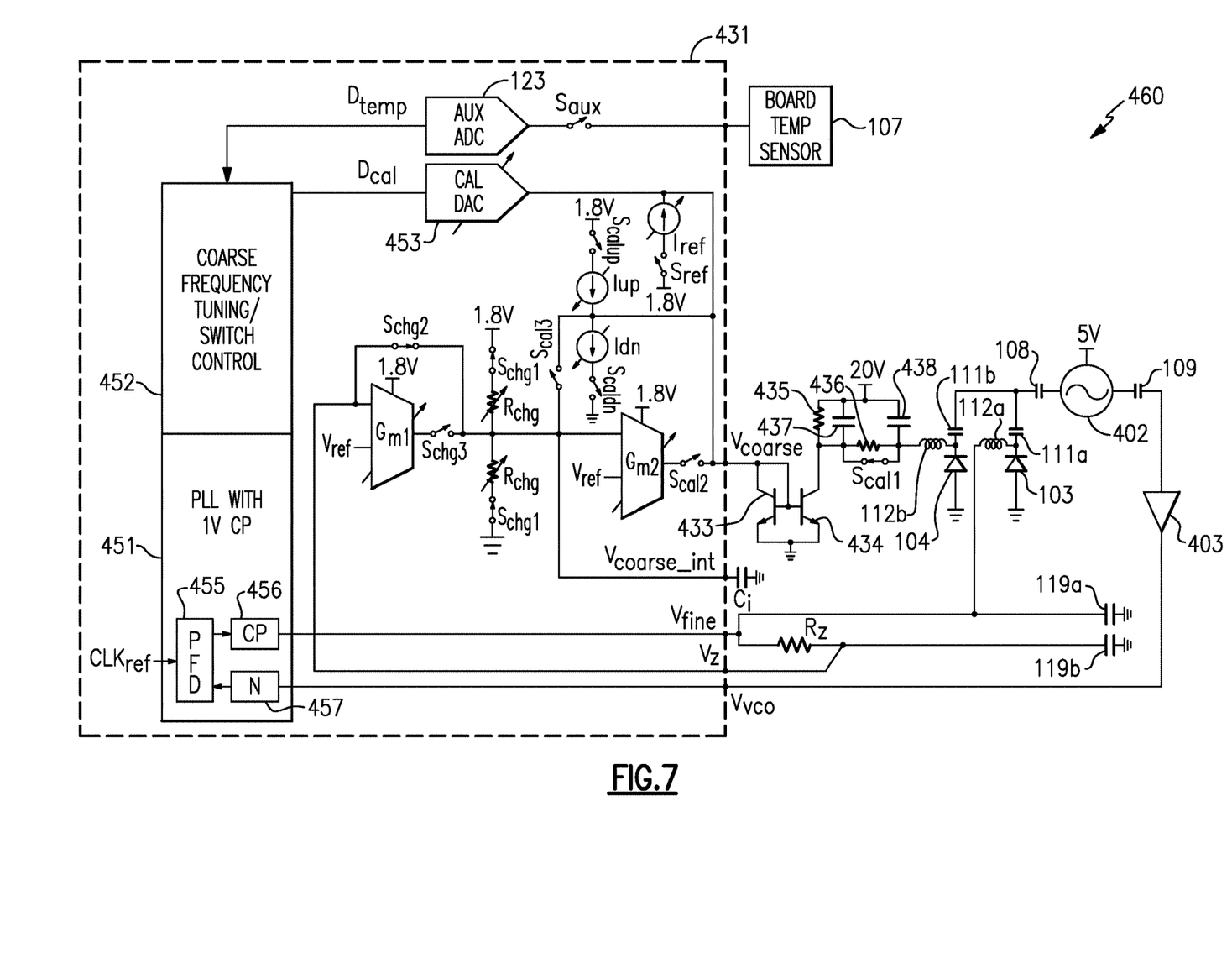
FIG. 7 is a schematic diagram of another embodiment of an electronic oscillator system including a semiconductor die operating in a first coarse calibration mode.

FIG. 7 is a schematic diagram of another embodiment of an electronic oscillator system 460 including a semiconductor die 431 operating in a first coarse calibration mode.

The electronic oscillator system 460 includes the semiconductor die 431 and a circuit board including various external components to the semiconductor die 431. The external components include an external VCO 402 (powered by a 5V supply, in this example), a first varactor 103, a second varactor 104, a temperature sensor 107, a VCO input capacitor 108, a VCO output capacitor 109, a first varactor series capacitor 111a, a second varactor series capacitor 111b, a first varactor biasing inductor 112a, a second varactor biasing inductor 112b, a fine capacitor 119a, a sense capacitor 119b, a VCO clock buffer 403, a first current mirror transistor 433, a second current mirror transistor 434, a current mirror load resistor 435 (coupled to a 20V supply, in this example), a coarse bias resistor 436, a first current mirror load capacitor 437, a second current mirror load capacitor 438, a first calibration switch $S_{cal1}$, a coarse integration capacitor $C_i$, and a sense resistor $R_z$.

The semiconductor die 431 of FIG. 7 includes a PLL 451, a coarse frequency tuning/switch control calibration circuit 452, an auxiliary ADC 123, an auxiliary switch $S_{aux}$, a calibration DAC 453, a calibration DAC reference current source $I_{ref}$, a calibration DAC reference current switch $S_{ref}$ (used in combination with $I_{ref}$ to calibrate the DAC 453, in some implementations), a second calibration switch $S_{cal2}$, a third calibration switch $S_{cal3}$, a calibration up switch $S_{calup}$, a calibration down switch $S_{caldn}$, an up current source Iup, a down current source Idn, first charging switches $S_{chg1}$, a second charging switch $S_{chg2}$, a third charging switch $S_{chg3}$, charging resistors $R_{chg}$ (connected between a 1.8V supply and ground when $S_{chg1}$ are closed), a first controllable transconductance circuit $G_{m1}$ (receiving a reference voltage $V_{ref}$), and a second controllable transconductance circuit $G_{m2}$ (receiving the reference voltage $V_{ref}$). The semiconductor die 431 also including various pins or pads including a coarse tuning pin $V_{coarse}$, a fine tuning pin $V_{fine}$, a range sensing pin $V_Z$, a coarse integration pin $V_{coarse}$ nit, and a VCO sensing pin $V_{vco}$.

The external VCO 402 is tuned by both the first varactor 103 (fine varactor) and the second varactor 104 (coarse varactor). The first varactor 103 is controlled by the voltage of the fine tuning pin $V_{fine}$ set by the PLL 451, which includes a PFD 455 (receiving a reference clock signal $CLK_{ref}$ and a feedback clock signal), a charge pump 456, and a feedback divider 457.

The second varactor 104 (coarse varactor) is controlled by the coarse frequency tuning/switch control calibration circuit 452, which controls the calibration DAC 453 as well as the state of the depicted switches. The coarse frequency tuning/switch control calibration circuit 452 receives a temperature signal $D_{temp}$ from the auxiliary ADC 123, and provides a calibration DAC code $D_{cal}$ to the calibration DAC 453.

The semiconductor die 431 is operable in multiple modes for controlling the coarse voltage pin $V_{coarse}$. The modes include a first mode (DAC/$G_m$-C mode) in which the calibration DAC 453 and the transconductance circuits $G_{m1}$ and $G_{m2}$ are used for coarse calibration, and a second mode (charge pump/$G_m$-C mode) in which the calibration charge pump ($S_{calup}$, Iup, Idn, and $S_{caldn}$) and the first transconductance circuit $G_{m1}$ are used for coarse calibration.

An electronic oscillator system can be implemented with a selection of board components desired for a particular application, and the semiconductor die 431 can provide coarse calibration using the first mode (DAC/$G_m$-C mode) or the second mode (charge pump/$G_m$-C mode) based on the chosen board components for that application. For example, the first mode (DAC/$G_m$-C mode) can provide less performance with less board complexity, while the second mode (charge pump/$G_m$-C mode) can provide higher performance at the cost of increased board component complexity.

The electronic oscillator system 460 of FIG. 7 is implemented with external components suitable for operating in the first mode (DAC/$G_m$-C mode). Table 1 below depicts operation of three states of the first mode (DAC/$G_m$-C mode), where ON=1 and OFF=0. The states are operated in sequence, beginning with a reset state, thereafter transitioning to a calibration state, and ending in a tracking state. The reset state is used to reset voltage levels of nodes, while the calibration state is used to calibrate the voltage levels to suitable values. Thereafter, the tracking state is entered in which the transconductance circuits $G_{m1}/G_{m2}$ control the coarse voltage pin $V_{coarse}$ based on the ranging sensing pin $V_z$. In this example, current integration is provided by the integration capacitor $C_i$, and in the tracking mode the second transconductance stage $G_{m2}$ buffers the integration capacitor's voltage to control the coarse voltage pin $V_{coarse}$. In this example, a current mirror is controlled by the coarse voltage pin $V_{coarse}$ to thereby control the biasing of the coarse varactor 104.

TABLE 1

| | Reset State | Calibration State | Tracking State |
|---|---|---|---|
| $S_{cal1}$ | 1 | 1 | 0 |
| $S_{cal2}$ | 0 | 0 | 1 |
| $S_{cal3}$ | 0 | 0 | 0 |
| $S_{chg1}$ | 1 | 1 | 0 |
| $S_{chg2}$ | 1 | 1 | 0 |
| $S_{chg3}$ | 0 | 0 | 1 |
| $S_{calup}$ | 0 | 0 | 0 |
| $S_{caldn}$ | 0 | 0 | 0 |
| Gm1 | Powered Up | Powered Up | Powered Up |
| Gm2 | Powered Up | Powered Up | Powered Up |
| Calibration DAC | Powered Up | Powered Up | Powered Up |
| Calibration charge pump | Powered Down/ tri-stated | Powered Down/ Tri-stated | Powered Down/ Tri-stated |
| PLL charge pump | Tri-stated | Tri-stated | Enabled |

One embodiment of the first mode will now be described with reference to FIG. 7. In this embodiment, the coarse frequency tuning/switch control calibration circuit 452 operates as a finite state machine (FSM) that begins in the reset state. Additionally, during reset, PLL blocks are powered up by separate power up signals from the local serial peripheral interface (SPI) residing in the PLLs (can be initiated by firmware). Additionally, external VCOs, synth, and external circuits are powered up and ready for calibration (can be initiate by firmware).

The FSM transitions from the reset state to the calibration state when a new frequency is written to the semiconductor die 431. In the calibration state, the PLL loops can be opened, and the PFD put in reset. Additionally, the FSM can perform a search (for instance, a binary search or a linear search) for the calibration DAC code $D_{cal}$. For example, binary search can start with most significant bit (MSB) high, and the current from the DAC generates a coarse voltage for the external VCO using the external bipolar transistor and RC components. After each DAC bit trial, wait for a programmable amount of time for DAC to settle before starting frequency measurement. The measured frequency of the external VCO can be compared to the PLL reference frequency or a frequency derived from the PLL reference frequency or to a predetermined target value. Furthermore, once all the bits of the calibration DAC 453 have been exercised, the FSM moves to the tracking state.

In the tracking state, the charge pump tri-stating is released (through control of the PFD), and thereafter tracking is provided by locking of the VCO calibration loop by transconductance circuits $G_{m1}$ and $G_{m2}$ as well as integration capacitor Ci where the first transconductance circuit $G_{m1}$ senses the fine voltage, compares it to a reference and generates current to drive the second transconductance circuit $G_{m2}$. Additionally, the second transconductance compares the output to a reference and further drives the coarse tuning voltage pin $V_{coarse}$.

Figure 8:
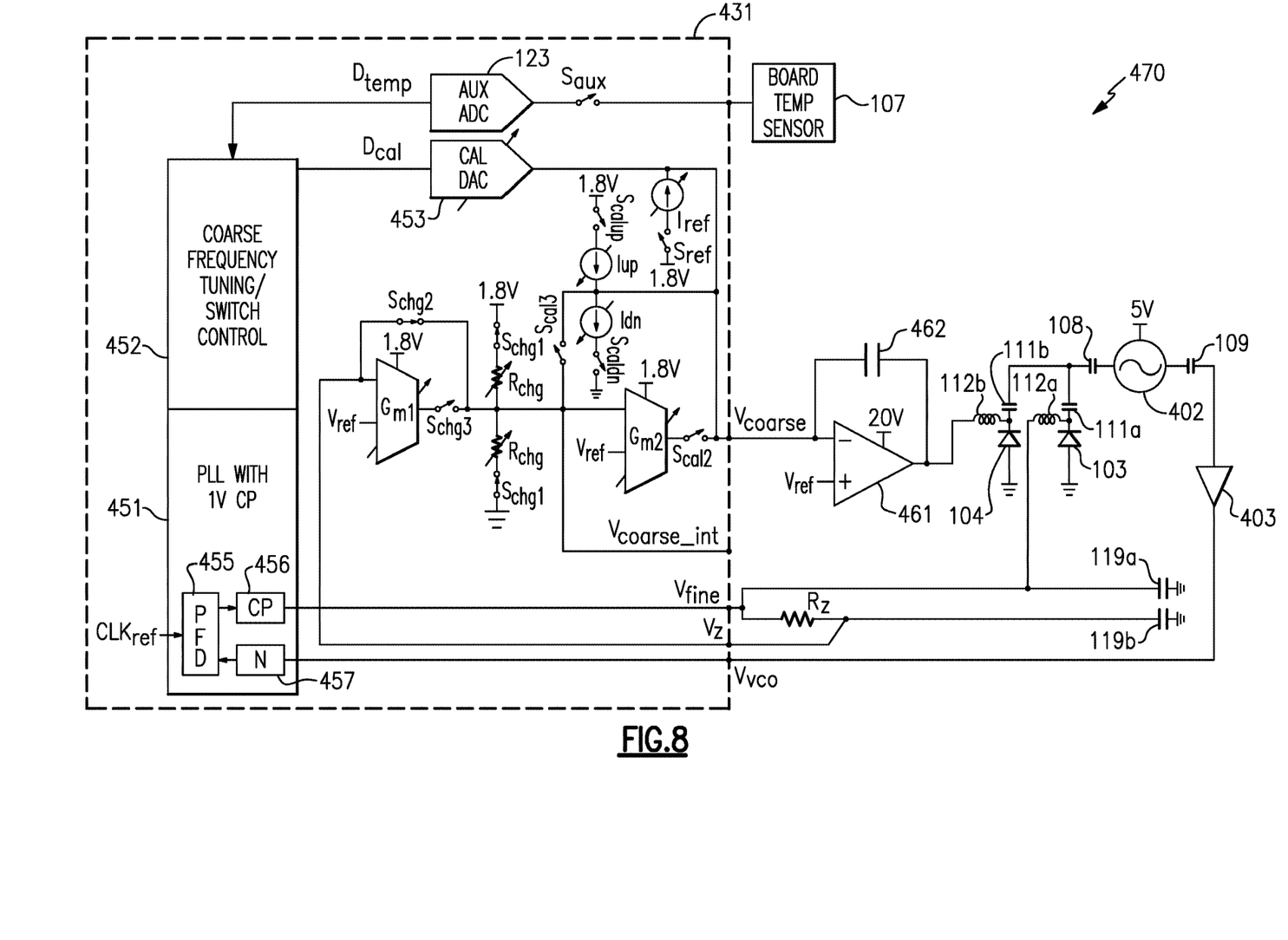
FIG. 8 is a schematic diagram of another embodiment of an electronic oscillator system including a semiconductor die operating in a second coarse calibration mode.

FIG. 8 is a schematic diagram of another embodiment of an electronic oscillator system 470 including a semiconductor die operating in a second coarse calibration mode.

The electronic oscillator system 470 includes the semiconductor die 431 and a circuit board including various external components to the semiconductor die 431. The external components include an external VCO 402 (powered by a 5V supply, in this example), a first varactor 103, a second varactor 104, a temperature sensor 107, a VCO input capacitor 108, a VCO output capacitor 109, a first varactor series capacitor 111a, a second varactor series capacitor 111b, a first varactor biasing inductor 112a, a second varactor biasing inductor 112b, a fine capacitor 119a, a sense capacitor 119b, a VCO clock buffer 403, an amplifier 461, a feedback integration capacitor 462, and a sense resistor $R_z$.

The semiconductor die 431 of FIG. 8 includes a PLL 451, a coarse frequency tuning/switch control calibration circuit 452, an auxiliary ADC 123, an auxiliary switch $S_{aux}$, a calibration DAC 453, a calibration DAC reference current source $I_{ref}$, a calibration DAC reference current switch $S_{ref}$, a second calibration switch $S_{cal2}$, a third calibration switch $S_{cal3}$, a calibration up switch $S_{calup}$, a calibration down switch $S_{caldn}$, an up current source Iup, a down current source Idn, first charging switches $S_{chg1}$, a second charging switch $S_{chg2}$, a third charging switch $S_{chg3}$, charging resistors $R_{chg}$ (connected between a 1.8V supply and ground when $S_{chg1}$ are closed), a first controllable transconductance circuit $G_{m1}$ (receiving a reference voltage $V_{ref}$), and a second controllable transconductance circuit $G_{m2}$ (receiving the reference voltage $V_{ref}$). The semiconductor die 431 also including various pins or pads including a coarse tuning pin $V_{coarse}$, a fine tuning pin $V_{fine}$, a range sensing pin $V_z$, a coarse integration pin $V_{coarse\_int}$, and a VCO sensing pin $V_{vco}$.

The external VCO 402 is tuned by both the first varactor 103 (fine varactor) and the second varactor 104 (coarse varactor). The first varactor 103 is controlled by the voltage of the fine tuning pin $V_{fine}$ set by the PLL 451, which includes a PFD 455 (receiving a reference clock signal $CLK_{ref}$ and a feedback clock signal), a charge pump 456, and a feedback divider 457.

As discussed earlier with reference to FIG. 7, the semiconductor die 431 is operable in multiple modes for controlling the coarse voltage pin $V_{coarse}$. The modes include a first mode (DAC/$G_m$-C mode) in which the calibration DAC 453 and the transconductance circuits $G_{m1}$ and $G_{m2}$ are used for coarse calibration, and a second mode (charge pump/ $G_m$-C mode) in which the calibration charge pump ($S_{calup}$, Iup, Idn, and $S_{caldn}$) and the first transconductance circuit $G_{m1}$ are used for coarse calibration.

The electronic oscillator system 470 of FIG. 8 is implemented with external components suitable for operating in the second mode (charge pump/$G_m$-C mode). Table 2 below depicts operation of three states of the second mode (charge pump/$G_m$-C mode), where ON=1 and OFF=0. The states are operated in sequence, beginning with a reset state, thereafter transitioning to a calibration state, and ending in a tracking state. The reset state is used to reset voltage levels of nodes, while the calibration state is used to calibrate the voltage levels to suitable values. Thereafter, the tracking state is entered in which the transconductance stage $G_{m1}$ control the coarse voltage pin $V_{coarse}$ based on the ranging sending pin $V_z$. In this example, integration of a coarse voltage is provided externally by the amplifier 461 and the feedback integration capacitor 462. The output of the amplifier 461 (in a 20 V domain, in this example) controls the biasing of the coarse varactor 104.

TABLE 2

| | Reset State | Calibration State | Tracking State |
|---|---|---|---|
| $S_{cal1}$ | 1 | 1 | 0 |
| $S_{cal2}$ | 0 | 0 | 0 |
| $S_{cal3}$ | 0 | 0 | 1 |
| $S_{chg1}$ | 1 | 1 | 0 |
| $S_{chg2}$ | 1 | 1 | 0 |
| $S_{chg3}$ | 0 | 0 | 1 |
| $S_{calup}$ | Driven by FSM | Driven by FSM | 0 |
| $S_{caldn}$ | Driven by FSM | Driven by FSM | 0 |
| Gm1 | Powered Up | Powered Up | Powered Up |
| Gm2 | Powered Down | Powered Down | Powered Down |
| Calibration DAC | Powered Down | Powered Down | Powered Down |
| Calibration charge pump | Powered Up | Powered Up | Powered Down |
| PLL charge pump | Tri-stated | Tri-stated | Enabled |

One embodiment of the second mode will now be described with reference to FIG. 8. In this embodiment, the coarse frequency tuning/switch control calibration circuit 452 operates as an FSM that begins in the reset state. In the reset state, PLL blocks are powered up by separate power up signals from the local SPI residing in the PLLs (can be initiated by firmware). Additionally, external VCOs, synth, and external circuits are powered up and ready for calibration (can be initiate by firmware).

The FSM transitions from the reset state to the calibration state when a new frequency is written to the semiconductor die 431. In the calibration state, the PLL loops can be opened, and the PFD put in reset. Additionally, the FSM sets the up and down controls of the calibration charge pump ($S_{calup}$ and $S_{caldn}$), and the current from the calibration charge pump is integrated on the external capacitor 462 according to the polarity of the current from the calibration charge pump which is either sourcing current (when Scamp is on) or sinking current (when $S_{caldn}$ is on). After waiting for a programmable amount of time for settling, the frequency of the external VCO 402 is measured. Additionally, the measured VCO frequency to the PLL reference frequency is compared to a frequency derived from the PLL reference frequency or to a predetermined target value.

Once the VCO frequency approaches the target frequency, the FSM moves to the tracking state. In the tracking state, the charge pump tri-stating is released through the PFD, and the tracking loop thereafter performs a lock where the first transconductance circuit $G_{m1}$ senses the fine voltage, compares it to a reference and generates current to drive the external amplifier and integration capacitor.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. An electronic oscillator system comprising: a semiconductor die;
   a controllable oscillator external to the semiconductor die and having an output configured to provide an output oscillator signal;
   a first varactor configured to tune an oscillation frequency of the controllable oscillator; and
   a second varactor configured to tune the oscillation frequency of the controllable oscillator,
   wherein the semiconductor die comprises a phase-locked loop (PLL) configured to provide a fine tuning to the controllable oscillator by controlling a tuning voltage of the first varactor, and a calibration circuit configured to provide a coarse tuning to the controllable oscillator by controlling the second varactor, the calibration circuit configured to provide the coarse tuning based on the tuning voltage of the first varactor and the output oscillator signal.

2. The electronic oscillator system of claim 1, wherein the semiconductor die further includes a coarse tuning voltage pin configured to output a coarse control voltage, the electronic oscillator system further comprising a coarse voltage scaling circuit configured to scale the coarse control voltage to generate a varactor control voltage for the second varactor.

3. The electronic oscillator system of claim 1, wherein the semiconductor die comprises a coarse tuning voltage pin configured to output a coarse control voltage for controlling the second varactor, a calibration digital-to-analog converter (DAC), and a calibration charge pump, the calibration circuit operates in a first mode in which the calibration DAC sets a voltage level of the coarse tuning voltage pin and a second mode in which the calibration charge pump sets the voltage level of the coarse control voltage.

4. The electronic oscillator system of claim 3, wherein the semiconductor die further comprises a first transconductance stage and a second transconductance stage, wherein in the first mode the first transconductance stage and the second transconductance stage operate in series to adjust the voltage level of the coarse tuning voltage pin after set by the calibration DAC, and wherein in the second mode the first transconductance stage adjust the voltage level of the coarse tuning voltage pin after set by the calibration charge pump.

5. The electronic oscillator system of claim 4, wherein in the first mode the first transconductance stage generates a current based on comparing a reference signal to a sensed fine voltage for controlling the first varactor, and the second transconductance stage receives the current and drives the coarse tuning voltage pin.

6. The electronic oscillator system of claim 1, wherein the semiconductor die further includes a coarse tuning voltage pin for controlling the second varactor and a digital-to-analog converter (DAC) having an input that receives digital data from the calibration circuit and an output connected to the coarse tuning voltage pin.

7. The electronic oscillator system of claim 1, wherein the semiconductor die further includes a coarse tuning voltage pin for controlling the second varactor, a first DAC for controlling the coarse tuning voltage pin based on a process-voltage-temperature (PVT) code and a second DAC for controlling the coarse tuning voltage pin based on an oscillator voltage range sensed by the calibration circuit.

8. The electronic oscillator system of claim 1, wherein the calibration circuit is configured to calibrate an amplitude of the controllable oscillator based on controlling a bias of the controllable oscillator and observing the output oscillator signal of the controllable oscillator.

9. The electronic oscillator system of claim 1, wherein the calibration circuit is configured to compare the tuning voltage set by the PLL to an upper threshold signal and a lower threshold signal.

10. The electronic oscillator system of claim 9, wherein the calibration circuit further includes a first comparator for comparing the tuning voltage to the upper threshold signal, a second comparator for comparing the tuning voltage to the lower threshold signal, a counter controlled based on an output of the first comparator and an output of the second comparator, and an integrator configured to integrated an output of the comparator.

11. The electronic oscillator system of claim 1, further comprising an external temperature sensor, wherein the calibration circuit operates based on temperature data received from the external temperature sensor.

12. The electronic oscillator system of claim 1, wherein the second varactor provides higher frequency versus voltage gain than the first varactor.

13. A method of electronic oscillator control, the method comprising:
tuning an oscillation frequency of a controllable oscillator using a first varactor, the controllable oscillator external to a semiconductor die and having an output providing an output oscillator signal;
tuning the oscillation frequency of the controllable oscillator using a second varactor;
controlling a tuning voltage of the first varactor to provide a fine tuning to the controllable oscillator using a phase-locked loop (PLL) on the semiconductor die; and
controlling the second varactor to provide a coarse tuning to the controllable oscillator using a calibration circuit of the semiconductor die, the calibration circuit providing the coarse tuning based on the tuning voltage of the first varactor and the output oscillator signal.

14. The method of claim 13, further comprising outputting a coarse control voltage from a coarse tuning voltage pin of the semiconductor die, and scaling the coarse control voltage to generate a varactor control voltage for the second varactor using an amplifier.

15. The method of claim 14, further comprising operating the semiconductor die in one of a first mode in which a calibration DAC sets a voltage level of the coarse tuning voltage pin or a second mode in which a calibration charge pump sets the voltage level of the coarse control voltage.

16. The method of claim 13, further comprising receiving digital data from the calibration circuit as an input to a digital-to-analog converter (DAC), and providing a coarse control voltage from an output of the DAC to a coarse tuning voltage pin of the semiconductor die.

17. The method of claim 13, further comprising comparing the tuning voltage set by the PLL to an upper threshold signal and to a lower threshold signal.

18. A radio frequency communication system comprising:
a mixer controlled by an output oscillator signal; and
a local oscillator comprising:
a semiconductor die,
a controllable oscillator external to the semiconductor die and having an output configured to provide an output oscillator signal,
a first varactor configured to tune an oscillation frequency of the controllable oscillator, and
a second varactor configured to tune the oscillation frequency of the controllable oscillator,
wherein the semiconductor die comprises a phase-locked loop (PLL) configured to provide a fine tuning to the controllable oscillator by controlling a tuning voltage of the first varactor, and a calibration circuit configured to provide a coarse tuning to the controllable oscillator by controlling the second varactor, the calibration circuit configured to provide the coarse tuning based on the tuning voltage of the first varactor and the output oscillator signal.

19. The radio frequency communication system of claim 18, wherein the calibration circuit is configured to compare the tuning voltage set by the PLL to an upper threshold signal and a lower threshold signal.

20. The radio frequency communication system of claim 18, wherein the second varactor provides higher frequency versus voltage gain than the first varactor.

* * * * *